(12) United States Patent
Jeong et al.

(10) Patent No.: US 10,324,107 B2
(45) Date of Patent: Jun. 18, 2019

(54) ACCELERATION DETECTION DEVICE

(71) Applicant: HITACHI AUTOMOTIVE SYSTEMS, LTD., Hitachinaka-shi, Ibaraki (JP)

(72) Inventors: Heewon Jeong, Ibaraki (JP); Masahide Hayashi, Ibaraki (JP); Kiyoko Yamanaka, Tokyo (JP); Daisuke Maeda, Tokyo (JP)

(73) Assignee: HITACHI AUTOMOTIVE SYSTEMS, LTD., Hitachinaka-shi (JP)

( * ) Notice: Subject to any disclaimer, the term of this patent is extended or adjusted under 35 U.S.C. 154(b) by 214 days.

(21) Appl. No.: 15/304,243

(22) PCT Filed: Apr. 8, 2015

(86) PCT No.: PCT/JP2015/060909
§ 371 (c)(1),
(2) Date: Oct. 14, 2016

(87) PCT Pub. No.: WO2015/166771
PCT Pub. Date: Nov. 5, 2015

(65) Prior Publication Data
US 2017/0219620 A1 Aug. 3, 2017

(30) Foreign Application Priority Data
Apr. 28, 2014 (JP) .................. 2014-092216

(51) Int. Cl.
*G01P 15/125* (2006.01)
*B81B 3/00* (2006.01)
(Continued)

(52) U.S. Cl.
CPC .............. *G01P 15/125* (2013.01); *B81B 3/00* (2013.01); *G01P 15/08* (2013.01); *H01L 29/84* (2013.01);
(Continued)

(58) Field of Classification Search
CPC ............ G01P 15/125; G01P 2015/0814; G01P 2015/0831
See application file for complete search history.

(56) References Cited

U.S. PATENT DOCUMENTS

2008/0290490 A1* 11/2008 Fujii .................... B81B 7/007
257/684
2009/0056444 A1 3/2009 Jeong et al.
(Continued)

FOREIGN PATENT DOCUMENTS

JP 2000-19198 A 1/2000
JP 2008-544243 A 12/2008
(Continued)

OTHER PUBLICATIONS

Extended European Search Report issued in corresponding application No. 15 78 6381 dated Jan. 15, 2018.

*Primary Examiner* — John E Chapman, Jr.
(74) *Attorney, Agent, or Firm* — Foley & Lardner LLP

(57) ABSTRACT

Provided is a highly reliable acceleration sensor having little 0-point drift. For example, an acceleration sensor having a support substrate having a first direction and a second direction orthogonal thereto in a single surface, a device layer disposed on the support substrate with a space interposed therebetween and having a weight that deforms according to the application of acceleration, and a cap layer disposed on the device layer with a space interposed therebetween, wherein a fixed part fixed to the support substrate is provided in the center of the weight, a beam is provided that extends from the fixed part and makes the weight mobile by being connected thereto, a plurality of posts for coupling the support substrate and the cap layer are disposed on the fixed part, and electric signals are applied to and received from the weight via the posts.

6 Claims, 7 Drawing Sheets

(51) Int. Cl.
*G01P 15/08* (2006.01)
*H01L 29/84* (2006.01)

(52) U.S. Cl.
CPC ............... *G01P 2015/0814* (2013.01); *G01P 2015/0831* (2013.01)

(56) References Cited

U.S. PATENT DOCUMENTS

| | | |
|---|---|---|
| 2009/0320596 A1 | 12/2009 | Classen et al. |
| 2010/0212423 A1 | 8/2010 | Rehle |
| 2011/0011182 A1 | 1/2011 | Yamaguchi et al. |
| 2014/0007685 A1 | 1/2014 | Zhang et al. |

FOREIGN PATENT DOCUMENTS

| | | |
|---|---|---|
| JP | 2010-513888 A | 4/2010 |
| JP | 5105968 B2 | 12/2012 |
| JP | 2014-16175 A | 1/2014 |
| WO | WO 2006/134232 A1 | 12/2006 |

* cited by examiner

A-A' CROSS-SECTIONAL DIAGRAM

B-B' CROSS-SECTIONAL DIAGRAM

C-C' CROSS-SECTIONAL DIAGRAM

ACCELERATION DETECTION DEVICE

TECHNICAL FIELD

The present invention relates to a MEMS (Micro Electro Mechanical Systems) which is formed by a semiconductor microfabrication technology measures acceleration by detecting a physical quantity associated with an inertial force generated in a vibrating object.

BACKGROUND ART

An electrostatic capacitance detection type acceleration sensor which is already known in PTL 1 or PTL 2 is configured with a mass being displaced according to applied acceleration and a detection electrode together with the mass forming electrostatic capacitance. The components may be formed on a silicon substrate having a plurality of layers by repeatedly performing a photolithography technique, an etching technique, and a substrate bonding technique.

In the acceleration sensor of PTL 1, the mass and the detection electrode are formed in a device layer provided so as to have a space on a support substrate. The mass is formed so as to move in a first direction within a plane of the device layer, and the detection electrode is formed so that the electrostatic capacitance formed by the through electrode and the mass is changed according to the displacement of the mass in the first direction. Therefore, the acceleration sensor of PTL 1 can detect acceleration applied in the first direction.

Furthermore, a fixed part which is fixed to the support substrate and supports the mass through a beam which can be displaced in the first direction (x direction) is formed in the central portion of the mass. For this reason, even in the case where distortion occurs in the support substrate due to a change in environment temperature or the like, it is possible to provide an acceleration sensor having small zero-point drift.

In the acceleration sensor of PTL 2, the support substrate and the cap layer are formed in a form of interposing the mass in the upper and lower portions thereof. The mass is configured so as to rotate around the first direction and the second direction, and the detection electrode is provided in the side of the cap layer so that electrostatic capacitance is changed according to the rotation of the mass. In addition, two detection electrodes are arranged so as to be equally spaced from a center of rotation of the mass. Therefore, the mass is rotated according to the acceleration applied in a third direction (z direction) perpendicular to the plane of the support substrate, so that the electrostatic capacitance of the detection electrode which is arranged in the direction where the mass is close to the side of the cap layer is increased. On the contrary, the electrostatic capacitance of the detection electrode which is arranged in the opposite direction symmetrically with respect to the rotational axis of the mass, namely, in the direction where the mass is apart from the cap layer is decreased. By performing differential detection of the electrostatic capacitance from the two through electrodes, an electric signal in proportion to the acceleration applied in the third direction can be obtained.

Furthermore, in the acceleration sensor of PTL 2, the center of rotation of the mass and a center of a cavity configured so the mass is surrounded by the support substrate and the cap layer are allowed to be coincident with each other. Namely, the two detection electrodes are arranged symmetrically with respect to the center of the mass and the center of the cavity. By such arrangement, in the case where distortion occurs in the acceleration sensing unit configured with the support substrate, the mass, the cap layer, and the like due to a change in peripheral temperature and the like, the two detection electrode are uniformly displaced in the direction where through electrodes are closer to or apart from the mass. Therefore, since the changes in electrostatic capacitance of the detection electrodes caused by the distortion are canceled out by the differential detection signals according to application of the acceleration can be extracted. As a result, it is possible to provide an acceleration sensor having small zero-point drift due to a change in mounting factors, environment temperature, and the like.

In PTL 3, the cavity is configured by arranging the support substrate and the cap layer in a form of interposing the mass in the upper and lower portion thereof. In addition, for the purpose of preventing deformation of the cavity caused by external factors such as a change in environment temperature, a plurality of posts are formed to connect a device layer where the support substrate and the mass are formed and the cap layer.

In an acceleration sensor disclosed in PTL 4, as a means of applying an electrical signal to the mass, a conductive structure passing through the support substrate or the cap layer is formed.

CITATION LIST

Patent Literature

PTL 1: JP 2010-513888 A.
PTL 2: JP 2008-544243 A.
PTL 3: JP 2000-19198 A
PTL 4: JP 5105968 B2

SUMMARY OF INVENTION

Technical Problem

In recent year, with expansion of the laws and regulations of safe car driving system such as anti-skid, anti-collision, and parking assistance or with development and popularization of various applications controlling posture and movement such as popularization of robots, demands and markets for MEMS-type acceleration sensors are rapidly expanded. Accordingly, even in a place such as an engine room of a car where environmental conditions such as peripheral temperature, humidity, and vibration are poor, a highly-reliable, inexpensive acceleration sensor of drift and temporal change of sensor performance such as a zero point or sensitivity is increasingly required.

As a representative inexpensive technique, there is known a method of configuring a cavity so that the mass is surrounded by the support substrate and the cap layer to protect the mass from an external physical three, connecting to a signal processing IC and the like through conductive wires, and after that, performing pressure-molding by using an inexpensive thermosetting resin.

However, in order to input and output an electrical signal from the signal processing IC with respect to the mass surrounded by the support substrate and the cap layer, conductive electrode materials (through electrode) passing through the support substrate or the cap layer need to be formed so as to approach the device layer where the mass is formed and need to be mechanically and electrically connected thereto. In addition, at the time of shipment and check of determining whether the acceleration sensing unit is correct, there is a need to check whether the through electrode is correctly connected to the device layer.

Furthermore, in the case of employing packaging using an inexpensive thermosetting resin, there is a problem in that deformation of the cavity and the acceleration sensing unit occurs due to the pressure during the pressure-molding, so that the zero point of the sensor is drifted. In addition, there is also a problem of temporal drift of the zero point involved with relaxation of internal stress generated in the thermosetting resin during the pressure-molding. Moreover, there is also a case where the volume of an organic material such as a thermosetting resin is changed (deformed) due to absorption of moisture.

The present invention is to provide a highly-reliable acceleration sensor having small zero-point drift or temporal change even in the case of being used under poor installation environment or employing an inexpensive thermosetting resin package.

Other objects and new features of the present invention will be clarified from the disclosure of the specification and the attached drawings.

Solution to Problem

Among the inventions disclosed in the application, overviews of representative inventions will be described in brief as follows.

A first acceleration sensor according to the present invention for solving the problem includes: a support substrate having a first direction and a second direction orthogonal thereto in a single surface; a device layer disposed on the support substrate with a space interposed therebetween; and a cap layer disposed on the device layer with a space interposed therebetween, the device layer having a mass provided therein, the mass being displaced according to application of acceleration, wherein a fixed part which is fixed to the support substrate and a beam which is provided to extend to the fixed part and is connected to the mass to allow the mass to be in a movable state are provided at a center of the mass, wherein a plurality of posts which connect the support substrate and the cap layer are provided to the fixed part, and wherein inputting and outputting of an electric signal with respect to the mass are performed through the posts.

In addition, a second acceleration sensor according to the present invention is an electrostatic capacitance detection type acceleration sensor, wherein the mass is configured so as to rotate around the first direction and the second direction according to application of acceleration in a third direction orthogonal to the first direction and the second direction, namely, so as to be displaced in the third direction, the displacement of the mass is output as an electric signal by detecting a change in electrostatic capacitance between detection electrodes formed in the mass and the support substrate or the cap layer, wherein a center of the mass and a center of a cavity which is configured with the support substrate and the cap layer so as to surround the mass are formed to be coincident with each other, wherein a center of rotation of the mass rotating around the first direction or the second direction is formed so as to be coincident with a center of the mass and the center of the cavity, wherein the detection electrodes are formed to be equally spaced from the center of the mass and the center of the cavity, wherein a plurality of the posts are provided in a central portion of the mass, and wherein inputting and outputting of an electric signal with respect to the mass are performed through the posts.

In addition, a third acceleration sensor according to the present invention is an electrostatic capacitance detection type acceleration sensor, wherein the mass is configured so as to rotate around the first direction and the second direction according to application of acceleration in a third direction orthogonal to the first direction and the second direction, namely, so as to be displaced in the third direction, the displacement of the mass is output as an electric signal by detecting a change in electrostatic capacitance between detection electrodes formed in the mass and the support substrate or the cap layer, wherein a center of the mass and a center of a cavity which is configured with the support substrate and the cap layer so as to surround the mass are formed to be coincident with each other, wherein a center of rotation of the mass rotating around the first direction or the second direction is formed so as not to be coincident with a center of the mass and the center of the cavity, wherein the detection electrodes are formed to be equally spaced from the center of the mass and the center of the cavity, wherein a plurality of the posts are provided in a central portion of the mass, and wherein inputting and outputting of an electric signal with respect to the mass are performed through the posts.

Advantageous Effects of Invention

According to the present invention, it is possible to provide a highly-reliable acceleration sensor having small zero-point drift or temporal change even in the case of being used under poor installation environment or employing an inexpensive thermosetting resin package.

DESCRIPTION OF EMBODIMENTS

Figure 1:
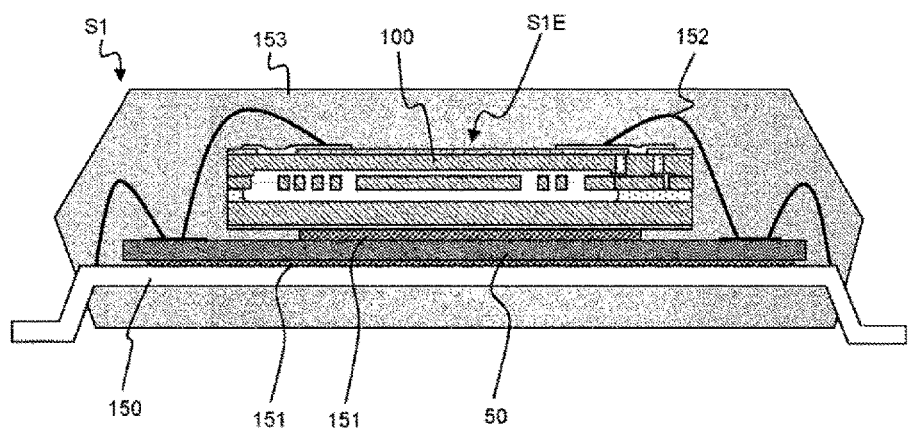
FIG. 1 is a mounting diagram illustrating a mounting form according to first to third embodiments of the present invention.

In an embodiment hereinafter, if needed for the convenience, the description is made in a manner where the embodiment is divided into plurality of sections or embodiments. However, except for the case where the relationship is particularly specified, the sections or embodiments are not unrelated to each other, but the one relates to a modified example, detailed description, auxiliary description, or the like of a portion or all of the other.

In addition, in the embodiments hereinafter, in the case where a number (including a number, a numerical value, an amount, a range, and the like) of an element is referred to, except for the case where it is particularly explicitly denoted, the case where it is clearly limited to a specific number according to a principle, or the like, it is not limited to the specific number, but it may be the specific number or more or may be the specific number or less.

In addition, in the embodiment hereinafter, the components (including elements, steps, and like) are not necessarily indispensable except for the components are particularly explicitly denoted, the case where the component are clearly considered to be indispensable according to a principle, or the like.

Similarly, in the embodiment hereinafter, when shapes, positional relationships, or the like of the components or the like are referred to, substantially approximate or similar shapes positional relationships or the like are considered to be included except for the case where the case where the shapes or the like are particularly explicitly denoted, the case where the shapes are clearly considered according to a principle, or the like. The similar description is true for the numerical value and the range.

In the entire drawings for describing the embodiments, the same number is denoted by the same reference numerals in principle, and redundant description thereof is omitted if possible. In addition, for the bettering understanding of the drawings, in some cases, hatching is provided in plan diagrams. Hereinafter, the embodiments of the present invention will be described with reference to the drawings.

First Embodiment

An acceleration sensor S1 according to a first embodiment of the present invention will be described with reference to the drawings.

FIG. 1 is a schematic diagram illustrating an overall configuration of the acceleration sensor S1. The acceleration sensor S1 according to the first embodiment is configured to include an acceleration sensing unit S1E, a signal processing IC 50, a lead frame 150, and a conductive wire 152 which is used for electrical connection among the acceleration sensing unit S1E, the signal processing IC 50, and the lead frame 150. In addition, the signal processing IC 50 and the acceleration sensing unit S1E are fixed on the lead frame 150 and the signal processing IC 50 through an adhesive 151, respectively.

Finally, the above components are covered with a thermosetting resin 153, so that a device having a function as an acceleration sensor is achieved. The acceleration sensor S1 is incorporated into a higher-level system to supply detected physical quantity information to the higher-level system, Next, a configuration, function, and effect of each component will be described in detail.

Figure 2:
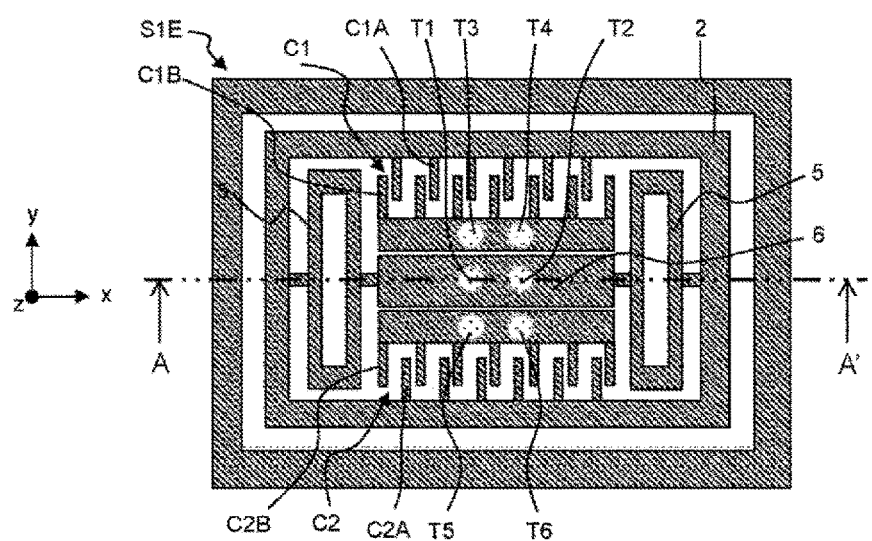
FIG. 2 is a schematic diagram of an overall configuration of an acceleration sensor according to the first embodiment of the present invention.

Herein, for the convenience of description, FIG. 2 illustrates posts (hereinafter, sometimes, referred to as through electrodes) T1 to T6 formed in a cap layer 100 in the state that the cap layer 100 is removed.

First, a configuration of the acceleration sensing unit S1E will be described. With respect to the acceleration sensing unit S1E, for example, an SOI (Silicon On Insulator) substrate 1 is used for forming mechanical components such as a mass or a fixed pan described later. With respect to the SOI substrate 1 illustrated in an A-A' cross-sectional diagram of FIG. 3, an intermediate insulating layer 1b is formed on a support substrate 1a, and a device layer 1c is formed on the intermediate insulating layer 1b.

The support substrate 1a is made of, for example, silicon (Si), and the intermediate insulating layer 1b is made of, for example, silicon oxide ($SiO_2$). In addition, the device layer 1c formed on the intermediate insulating layer 1b is made of, for example, a conductive silicon.

The total thickness of the support substrate 1a and the intermediate insulating layer 1b is, for example, in a range of several tens to several hundreds of micrometers, and the thickness of the device layer 1c is, for example, in a range of several to several tens of micrometers. In the first embodiment, the SOI substrate is used. However, the present invention is not limited to the SOI substrate as a semiconductor substrate, but various modifications are available. For example, a conductive polysilicon using a surface MEMS technology, or for example, a plating metal such as nickel (Ni) may be used as the device layer.

Alternatively, the SOI substrate may be formed by processing cavities C1D and C2D, and the like in the support substrate 1a, forming the intermediate insulating, layer 1b through thermal oxidation, and attaching the device layer 1c.

Each component of the acceleration sensing unit S1E of the acceleration sensor S1 according to the first embodiment is formed by processing the device layer 1c of the SOI substrate 1 and the later-described cap layer 100. As a method of processing the device layer 1c and the cap layer 100, the device layer 1c or the cap layer 100 is coated with a resist reacting with light, electron beams, or the like, and after that, a portion of the resist of the device layer 1c or the cap layer 100 is removed by using a photolithography technology or an electron beam lithography technology. Next, the exposed device layer 1c or the exposed cap layer 100 is removed by performing a dry etching technique using RIE (Reactive Ion Etching) or a wet etching technique using alkaline chemicals such as TMAH or KOH. After that, by removing the remaining resist, the later-described components may be formed in the device layer 1c and the cap layer 100.

A mass 2 is formed in the acceleration sensing unit S1E of the acceleration sensor S1 according to the first embodiment by the above-described processing method. The mass 2 is suspended from the fixed part 6 through a flexible beam 5 in the x direction which is the first direction. The fixed part 6 is fixed to the support substrate 1a through the intermediate insulating layer 1b. Therefore, the mass 2 is displaced in the first direction in proportion to an acceleration applied in the first direction (x direction).

Detection electrodes C1 and C2 are formed in the device layer 1c for the purpose of measuring the displacement of the mass 2. Each detection electrode C1, C2 is formed in the mass 2 side and is configured with a movable electrode C1A, C2A which is displaced in association with the displacement of the mass 2 and a fixed electrodes C1B and C2B which, together with the movable electrode C1A, C2A, constitutes electrostatic capacitance and is fixed to the support substrate 1c. Furthermore, in association with the movement of the mass 2, the electrostatic capacitance of the detection electrodes C1 and C2 is arranged so that, in the case where one side is increased, the other side is decreased. For this reason, by using a differential detection method illustrated in FIG. 3, it is possible to obtain an output proportional to the applied acceleration. Components constituting the circuit will be described later in detail.

The cap layer 100 is provided to the acceleration sensing unit S1E for the purpose of protecting the mass 2, the beam 5, and the detection electrodes C1 and C2 from external impact, mechanical contact, dust, or the like. Furthermore, a trench is formed in the cap layer 100 by the above-described dry etching technique, and the trench is buried by insulating film 101 such as a thermal oxide film so as to maintain airtightness. By appropriately forming such a trench and burying the trench by the insulating film, a portion of the cap layer 100 can be electrically isolated from the periphery. Through electrodes T1 and T2 of FIG. 2 are formed by performing the above-described technique of forming the trench and the insulating film 101. In addition, the insulating film 101 may be formed by forming the trench and, after that, performing thermal oxidation or by using CVD (Chemical Vapor Deposition).

The cap layer 100 where the insulating film 101 and the through electrodes T1 and T2, and the like are formed is adhered to the SOI substrate 1 where the mass 2, the beam 5, and the like are formed, so that the mass 2 and the like can be protected from external mechanical contact and dust.

As the adhering method, there are well-known methods such as a eutectic bonding method of coating an area between the cap layer 100 and the device layer 1c with an alloy of gold, tin, or the like and curing through heat treatment, a room temperature activation bonding method of activating surfaces of the cap layer 100 and the device layer 1c by using plasma to directly bond silicon and silicon, or a method of cleaning the two surfaces with a mixed solution of an acid and pure water to generate hydroxyl groups on the surfaces, performing hydrogen bonding at room temperature, and heating at a high temperature to directly bond silicon and silicon. When the cap layer 100 is adhered to the device layer 1c, the through electrodes T1 and T2 are also connected to the device layer 1c, so that electric signals can be exchanges with the outside through the above-described pads E1 and E2.

Furthermore, similarly to the fixed part 6, the through electrodes T1 and T2 are provided in a portion where all the support substrate 1a, the intermediate insulating layer 1b, and the device layer 1c are connected. For this reason, the through electrodes also have a function of suppressing deformation of the cap layer 100 caused by the mounting and environment described later. Namely, the through electrodes T1 and T2 and the later-described other through electrodes have a function as posts as well as the function of applying external electric signals to each component.

In order to electrically connect the mass 2, the detection electrodes C1 and C2, and the like formed in the device layer 1c to the later-described signal processing IC 50, the pads E1, E2, and E3, and the like are formed. The pads E1, E2, and E3 enables electric signals to be input to and output from the mass 2, the detection electrodes C1 and C2, and the like formed in the device layer 1c through the through electrodes T1 and T2 and the like. Herein, the pad E3 is connected to peripheral silicon of the cap layer 100 besides the through electrodes T1 and T2. Furthermore, the peripheral silicon is adhered to a peripheral portion of the device layer 1c where the mass 2 and the like are formed. As a result, all of the through electrodes T1 and T2, the through electrodes T3, T4, T5, and T6 illustrated in FIG. 2, and the peripheral silicon besides the mass 2 and the detection electrodes C1 and C2 connected to the through electrodes are connected to the pad E3. By fixing the pad E3 to a constant voltage like grounding or the like, the mass 2, the detection electrodes C1 and C2, and like can be electrically shielded.

Next, the operation of the acceleration sensor according to the first embodiment will be described with reference to FIGS. 2, 3, and 4.

The acceleration sensor S1 according to the first embodiment obtains a sensor output which is proportional to an applied acceleration by detecting the displacement of the mass 2 which is moved in proportion to the acceleration applied in the first direction as a change in electrostatic capacitance of the detection electrodes C1 and C2. Herein, the mass 2 is suspended through the beam 5 from the fixed part 6 which is arranged in the central portion of the mass and is fixed through the insulating layer 1b to the support substrate 1a. Furthermore, fixed electrodes C1B and C2B of the detection electrodes C1 and C2 are also fixed to the central portion of the mass 2. For this reason, even in the case where distortion, deformation, or the like occurs in the acceleration sensor S1 caused by stress during the mounting, a change in environment temperature, or the like, influence on the beam 5 and the detection electrodes C1 and C2 is little, and initial and temporal zero-point drifts of the sensor are enabled to be small.

As described above, the through electrodes T1 to T6 are connected to the mass 2 and the detection electrodes C1 and C2. Interaction with the signal processing IC 50 is performed through the through electrodes and the like. For this reason, in order to secure high reliability, reliable mechanical and electrical connections are needed between the through electrodes T1 to T6 and the mass 2 and between the through electrodes and the detection electrodes C1 and C2.

However, since the mass 2 is connected to one fixed part 6 located at the central portion through the beam 5, the mass is electrically in an opened loop. Similarly, since the fixed electrodes C1B and C2B of the detection electrodes C1 and C2 are fixed only by the central portion, the detection electrodes are electrically in an opened loop. Therefore, it is difficult to check whether the through electrodes T1 to T6 are correctly connected to the mass 2 and the detection electrodes C1 and C2.

In general, the acceleration sensing unit S1E is manufactured by a semiconductor process such as the above-described RIE, wet etching, or photolithography and is assembled with the signal processing IC 50 or the like. For this reason, by selectively assembling only the acceleration sensing unit S1E that correctly operates, it is possible to eliminate the waste of other components such as the signal processing IC 50.

In the acceleration sensing unit S1E, two of through electrodes T1, T2, T3, T4, T5, and T6 are formed in each of the fixed part 6 to which the mass 2 is fixed through the beam 5 and the fixed electrodes C1B and C2B of the detection electrodes C1 and C2. By such a configuration, closed loops can be formed between the through electrodes T1 and T2, between the through electrodes T3 and T4, and between the through electrodes T5 and T6, and thus, by measuring respective electric resistance between the through electrodes, it is possible to check whether the through electrodes T1 to T6 are correctly connected to the mass 2 and the detection electrodes C1 and C2 formed in the device layer 1c. As a result, a selection operation of determining whether or not the acceleration sensing unit S1E is correct can be performed, so that it is possible to eliminate the waste of the signal processing IC 50 and the like.

In the detection electrodes C1 and C2, a carrier wave 51 from the signal processing IC 50 is applied through the through electrodes T3 and T4 to the fixed electrodes C1B and C2B of the detection electrodes C1 and C2. In addition, the mass 2 is connected through the through electrodes T1 and T2 and the pads E1 and E2 to an input terminal of a CV conversion unit 52. Therefore, a change in electrostatic capacitance between the movable electrodes C1A and C2A and the fixed electrodes C1B and C2B of the detection electrodes C1 and C2 provided in the mass 2 can be detected. There is no need that both a the through electrodes T1 and T2 are connected to the CV conversion unit 52, but any one of the through electrode may be connected.

An output signal from the CV conversion unit 52 is processed by a synchronization detection circuit 53 by the carrier wave 51 to be restored to an amplitude and frequency following the movement of the mass 2, and the resulting signal is converted to a digital signal by an AD conversion unit 54, so that a signal proportional to the applied acceleration is output.

In the acceleration sensor S1 according to the first embodiment, an example of performing packaging by pressure-molding a thermosetting resin as illustrated in FIG. 1 is described. However, the present invention is not limited to a packaging method of pressure-molding a thermosetting resin, but the effects of the present invention can be obtained even in a package where the acceleration sensing unit S1E is put into a container having a form in advance such as a ceramic package and is covered.

Particularly, in case of performing packaging by pressure-molding a thermosetting resin, although there is a possibility that the cap layer 100 is deformed by pressure at the time of pressure-molding, since the through electrodes T1 to T6 is configured and arranged so as to be connected to the support substrate 1a, the insulating layer 1b, the device layer 1c, and the cap layer 100, the through electrodes have a function as posts of suppressing deformation of the cap layer 100. Namely, although repeatedly stated, the through electrodes T1 to T6 have a function of suppressing destruction, deformation, and the like of the cap layer 100 as well as a purpose of applying electric signals to the components. Furthermore, the above-described utilization as a checking means for checking whether or not the sensing unit S1E is correct is a characteristic of the present invention.

In the acceleration sensor S1 according to the first embodiment, although the case where the mass 2 is moved in the first direction (x direction) is exemplified and described, the same effects can be obtained in the case where the mass 2 is moved in the second direction. (y direction).

Furthermore, although not shown, it should be noted that, if the acceleration sensing unit S1E is arranged to be rotated by 90 degrees, the acceleration in the second direction can be simply detected.

In addition, if two sensing units S1E are arranged on the same substrate in the state that the sensing unit is rotated by 90 degree, the acceleration sensor can also be used as 2-axis acceleration sensor capable of sensing the acceleration in the first direction and the acceleration in the second direction.

Although the present invention can be applied to a mass that is moved in the third direction (z direction), since there are different additional effects, the acceleration sensors will be described in detail as other embodiments.

Second Embodiment

Figure 5:
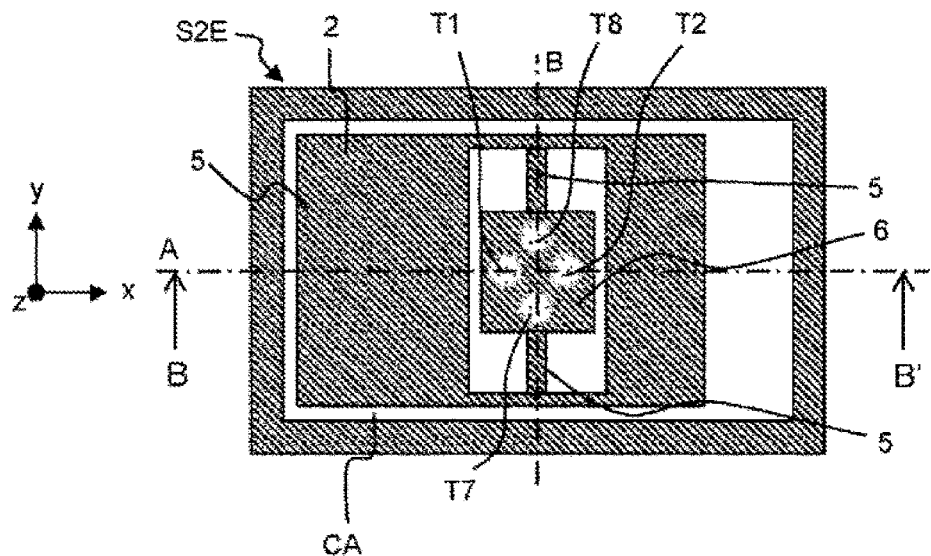
FIG. 5 is a schematic diagram of an overall configuration of an acceleration sensor according to the second embodiment of the present invention.

In a second embodiment of the present invention, similarly to the first embodiment, an acceleration sensor S2 according to the second embodiment will be described with reference to the drawings. FIG. 5 is a schematic plan diagram illustrating main components of the acceleration sensor S2 according to the second embodiment.

A method of manufacturing the acceleration sensor S2 according, to the second embodiment is the same as that of the acceleration sensor S1 according to the first embodiment. The point different from that of the first embodiment is a configuration of the acceleration sensor S2, and in the acceleration sensor S2 according to the second embodiment, the mass 2 is configured to be moved in the third direction.

First, the configuration of the acceleration sensor S2 according to the second embodiment is be described with reference to FIG. 5. However, the redundant contents of the acceleration sensor S1 according to the first embodiment are omitted in description, and modified and added contents are mainly described.

In addition, similarly to FIG. 2 illustrating the configuration of the acceleration sensing unit S1E in the acceleration sensor S1 according to the first embodiment, for the convenience of description, FIG. 5 also illustrates through electrodes T1, T2, T7, and T8 formed in the cap layer 100 in the state that the cap layer 100 is removed.

The acceleration sensing unit S2E in the acceleration sensor S2 according to the second embodiment is different from the acceleration sensing unit S1E according to the first embodiment in terms that the mass 2 is configured to be moved in the third direction (z direction).

The fixed part 6 is fixed through the intermediate insulating layer 1b to the support substrate 1a in the central portion of the cavity CA formed by the support substrate 1c and the cap layer 100 so as to surround the mass 2. In addition, the fixed part 6 is provided with two beams 5 extending along a center line (line B) of the cavity CA in the second direction (y direction), and the mass 2 is connected to the distal ends thereof.

The mass 2 is formed so that weights of portions divided by the beam 5 as a central axis are different in the first direction (x direction). Namely, when acceleration is applied in the third direction (z direction), the force exerted on the mass 2 at the left side of the beam 5 and the force exerted on the mass at the right side are different. In addition, since the distance from the center of the right portion of the mass 2 to the beam 5 and the distance from the center of the left portion of the mass 2 to the beam 5 are also different, unbalance is generated in the moment acting on the beam 5 which becomes the center of rotation of the mass 2. For this reason, the mass 2 is rotated around the second direction (y direction) by using the beam 5 as a center of rotation in proportion to the acceleration applied in the third direction (z direction).

For the purpose of detecting the displacement of the mass 2, the through electrodes T3 and T4 as the fixed electrodes C1B and C2B of the detection electrodes C1 and C2 are formed in the cap layer 100 to form electrostatic capacitance between the through electrodes and the mass 2. Pads E4 and E5 are formed on the through electrodes T3 and T4, respectively, so that the through electrodes are electrically connected to the signal processing IC 50.

The through electrodes T3 and T4 which become the fixed electrodes C1B and C2B of the detection electrodes C1 and C2 are formed so as to be equally spaced in the first direction (x direction) by using the beam 5 the center of rotation and the center of the cavity CA) as a symmetry axis and so as to form the same magnitude of electrostatic capacitance. As described later in detail, according to such configuration, zero-point drift of the sensor caused by pressure-molding of the thermosetting resin, change in environment temperature, temporal change in mounting, and the like can be suppressed.

Figure 6:
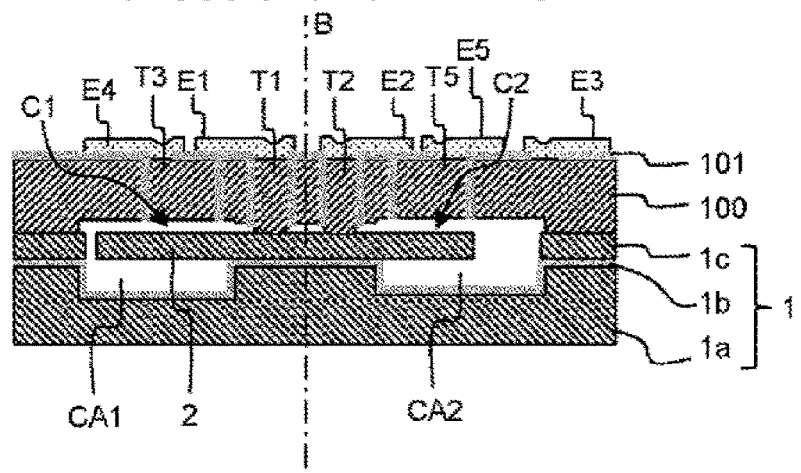
FIG. 6 is a cross-sectional diagram taken along line B-B' of FIG. 5.

In addition, as illustrated in FIGS. 5 and 6, four through electrodes T1, T2, T7, and T8 are connected to the fixed part 6 supporting the mass 2. Although even a single through electrode may be enough to input/output electric signals to/from the mass 2, similarly to the acceleration sensor S1 according to the first embodiment of the present invention, the through electrodes are provided for the purpose of forming a closed loop for checking whether or not the connection between the cap layer 100 and the device layer 1c is correct.

Furthermore, as described above, the through electrodes T1, T2, T7, and T8 have a function as posts of suppressing a change in capacitance of the detection electrodes C1 and C2 caused by deformation of the cap layer 100 according to the pressure applied at the time of performing packaging by pressure-molding the inexpensive thermosetting resin 153.

In the acceleration sensor S2 according to the second embodiment, in order to measure the displacement of the mass 2 in the third direction (z direction), the detection electrodes C1 and C2 utilize the through electrodes T3 and T5 formed in the cap layer 100 as the fixed electrodes C1B and C2B. For this reason, when the thermosetting resin 153 is pressure-molded, the electrostatic capacitance of the detection electrodes C1 and C2 is also changed according to the deformation of the cap layer 100.

In addition, in the embodiment, for the convenience of description, the change in capacitance of the detection electrodes C1 and C2 occurring at the time of pressure-molding of the thermosetting resin is exemplified. However, it can be easily considered that, since the acceleration sensing unit S2E is formed as a stacked structure of a plurality of different materials, for example, by using silicon for the support substrate 1a, a silicon oxide for the intermediate insulating layer 1b, and a metal material such as aluminum for the pads E1 to E5, the change in capacitance of the detection electrodes C1 and C2 according to the deformation of the acceleration sensing unit S2E or the cap layer 100 occurs due to a change in environment temperature or the like.

Similarly to the acceleration sensor S2 according to the second embodiment, the detection electrodes C1 and C2 are arranged so as to be equally spaced in the first direction (x direction) by using the beam 5 (the center of rotation) as a symmetry axis and so as to form electrostatic capacitance with the same magnitude, and so-called differential detection is performed by applying plus carrier wave to the detection electrode C1, applying minus carrier wave to the detection electrode C2, and inputting a summation thereof to the CV conversion circuit 52, so that the change in capacitance of detection electrodes C1 and C2 can be theoretically canceled out.

However, in the case where the amount of deformation of the acceleration sensing unit S2E or the cap layer 100 is large, the distance between the mass 2 that is the movable electrodes of the detection electrodes C1 and C2 and the through electrodes T3 and T5 that are the fixed electrodes is decreased. Therefore, even in the case where the two electrodes do not yet approach each other as well as in the case where the two electrodes are in contact with each other, there occur problems such as an abnormal increase in sensitivity of the sensor, a deterioration in linearity of output of the sensor, and a deterioration in resistance to environment vibration.

Furthermore, in the case where the detection electrodes C1 and C2 are arranged to be asymmetric with respect to the beam 5 (the center of rotation of the mass 2) or in the case where the amounts of deformation of the through electrodes T3 and T5 that are fixed electrodes of the detection electrodes C1 and C2 are different, in the differential detection method, the difference in capacitance between the detection electrodes C1 and C2 cannot be canceled out, but the difference in capacitance occurs as a zero point of the sensor.

Fortunately, the zero-point output of the sensor in the initial stage (zero-point output which is not changed in the product shipment state; herein, the zero-point output is an output of a sensor in the case where acceleration is not applied to the sensor, and in a normal period, the zero-point output is expected to be zero) can be electrically corrected.

However, in the case of the thermosetting resin, internal stress is generated in an inner portion of the resin during the pressure molding, and the internal stress is relaxed with time. Therefore, the amount of deformation of the cap layer 100 is also temporally changed. Furthermore, in the case of the thermosetting resin, it has been reported that the volume is increased or decreased according to environment humidity. Namely, it denotes that the amount of deformation of the cap layer 100 is also changed depending on the environment humidity. The zero-point drift depending on the environmental and temporal factors cannot be electrically corrected.

Therefore, in order to solve the above-described failures and problems, there is a need to suppress the initial and temporal changes of the detection electrodes C1 and C2. As a specific method, it is important that, by reducing the deformation of the cap layer 100 as small as possible, and even in the case where changes in electrostatic capacitance of the detection electrodes C1 and C2 occur due to the deformation of the cap layer 100, by equalizing the amounts of change of the electrodes, the difference between the amount of change is configured so as to be canceled out in the differential detection.

In the acceleration sensor S2 according to the second embodiment, (1) the fixed part 6 is arranged in the central portion (line B of FIG. 2) of the cavity CA, (2) the beam 5 that becomes the center of rotation of the mass 2 is also arranged on the center line (line B) of the cavity CA, and (3) the detection electrodes C1 and C2 are equally spaced in the first direction (x direction) by using the beam 5, the fixed part 6, and the center line (line B) of the cavity CA as a symmetry axis and so as to form the same capacitance. In addition, (4) the through electrodes T1, T2, T7, and T8 are arranged in the fixed part 6.

Next, the effects obtained by the above-described configurations (1) to (4) will lie described in detail.

First, the fixed part 6 or the beam 5 which becomes the center of rotation is arranged in the central portion (line B of FIG. 2) of the cavity CA, and the through electrodes T1, T2, T7, and T8 are arranged on the fixed part 6, so that the cavity CA is configured with the two cavities CA1 and CA2 having the same volume. In brief, the cap layer 100 is supported by the through electrodes T1, T2, T7, and T8, and thus, even in the case where external pressure is exerted, the cap layer is configured so as not to be destructed, that is, so that the amount of deformation becomes as small as possible. Furthermore, even in the case where deformation occurs in the cap layer 100, since the cavities CA1 and CA2 have the same volume, the amounts of deformation of the cap layer 100 constituting the cavities CA1 and CA2 become the same as each other.

Herein, although the reduction of the amount of deformation of the cap layer 100 by increasing the thickness of the cap layer 100 is easily considered, in order to form the through electrodes T1 to T8, there is a need to process a narrow trench in the cap layer 100 and to bury the trench so that the trench is air-tightly taken by the insulating films 101

Figure 3:
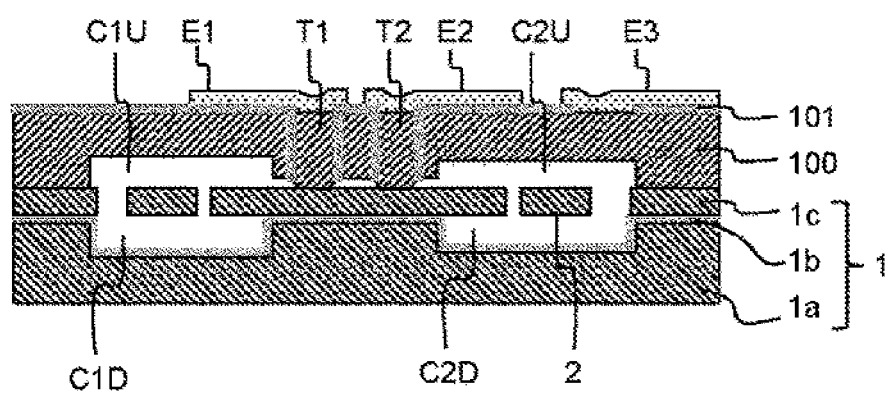
FIG. 3 is a cross-sectional diagram taken along line A-A' of FIG. 2.
Figure 4:
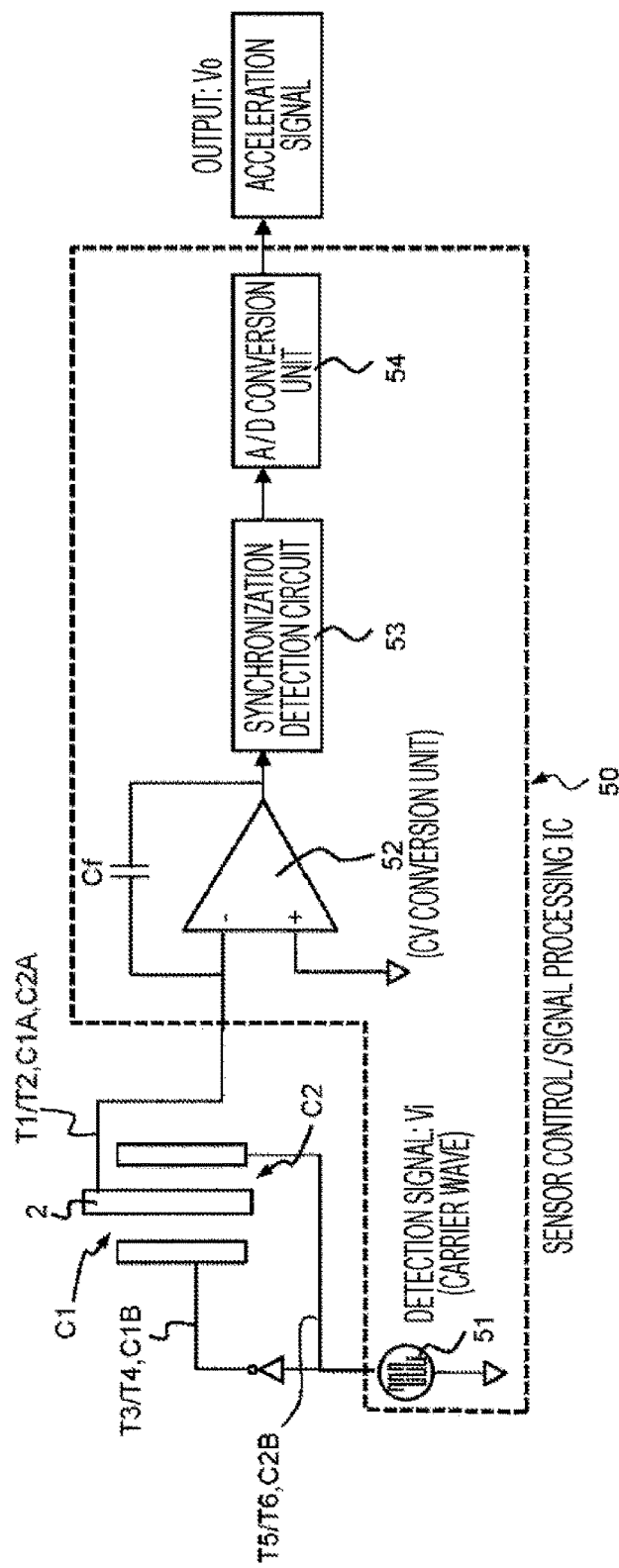
FIG. 4 is a conceptual diagram of an IC performing detection of capacitance and signal processing according to the first to third embodiments of the present invention.

(the insulating films at the left and right side of the through electrodes T1 and T2, T3, and T5 in FIGS. 3 and 6). However, in general, it has been reported that the ratio of the width of the trench and the thickness of the cap layer 100 is set to be 20 or less for the purpose of mass production. For this reason, there is a limit in increasing the thickness of the cap layer 100. In the acceleration sensor S2 according to the second embodiment, the width of the trench is set to be several micrometers, and the thickness of the cap layer 100 is set to be in a range of 100 to 400 μm.

Next, since the detection electrodes C1 and C2 are arranged so as to be equally spaced in the first direction (x direction) by using the center line (line B) of the beam 5, the fixed part 6, and the cavity CA as a symmetry axis and so as to form the same capacitance, even in the case where the cap layer 100 is deformed, the influence can be canceled out by using the differential detection means.

Namely, in the acceleration sensor S2 according to the second embodiment, the through electrodes T1, T2, T7, and T8 are arranged in the central portion of the cavity CA, and smaller cavities CA1 and CA2 having the same volume are formed, so that the deformation of the cap layer 100 is reduced. Furthermore, since the detection electrodes C1 and C2 are equally spaced from the center line of the cavity CA, the change in capacitance caused by the deformation of the cap layer 100 is canceled out, so that stability of the zero-point output of the sensor is improved.

Therefore, the through electrodes T1, T2, T7, and T8 have a function of dividing the above-described the cavity CA into the smaller cavities CA1 and CA2 having the same volume. For this reason, there is no need that the through electrodes T1, T2, T7, and T8 are arranged on the center line of the cavity CA, and the through electrodes may be arranged at the positions symmetrically separated from the center line (line B). Namely, it is preferable that the cavity CA is divided into the cavities CA1 and CA2 having the same volume.

In addition, in the acceleration sensor S2 according to the second embodiment, although it is described that the through electrodes T1, T2, T7, and T8 are arranged on the center line (line B), it can be understood that there is an allowable range with respect to the zero-point stability. Namely, if it is in an allowable range of the specification of the sensor, although there is a shift of several to several tens of micrometers, the effects of the present invention can be obtained.

Third Embodiment

Figure 7:
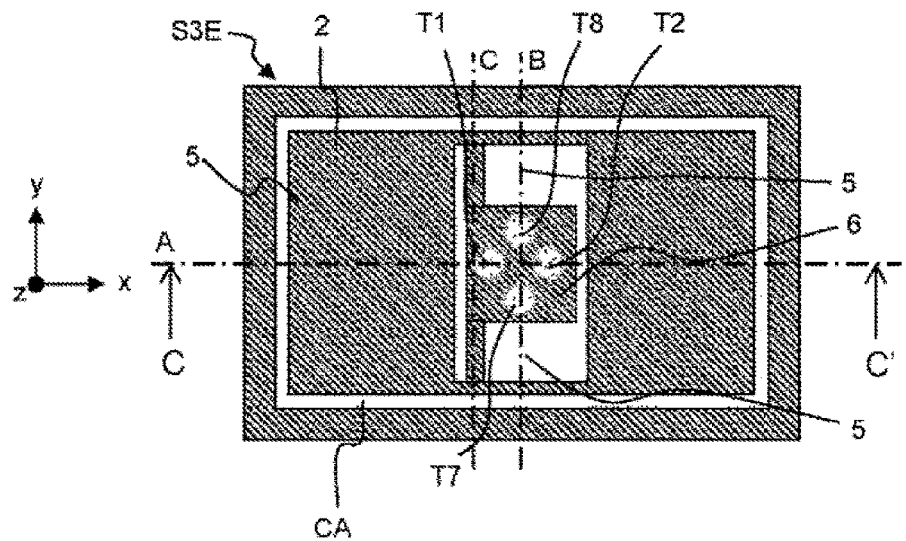
FIG. 7 is a schematic diagram of an overall configuration of an acceleration sensor according to the third embodiment of the present invention.
Figure 8:
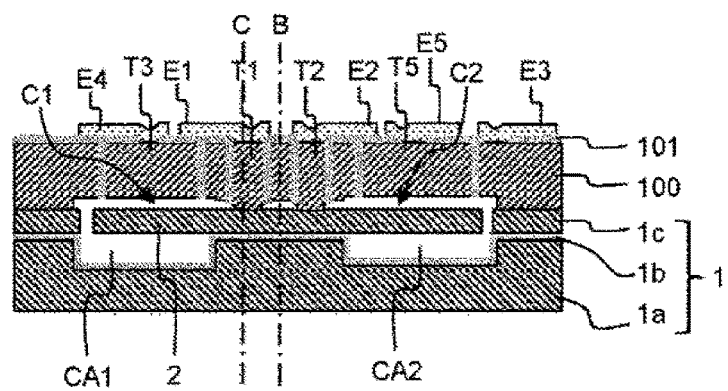
FIG. 8 is a cross-sectional diagram taken along line C-C' of FIG. 7.

In a third embodiment of the present invention, similarly to the first and second embodiments, an acceleration sensor S3 according to the third embodiment will be described with reference to the drawings. FIG. 7 is a schematic plan diagram illustrating main components of the acceleration sensor S3 according to the third embodiment, and FIG. 8 is an enlarged cross-sectional diagram taken along line C-C'.

A method of manufacturing the acceleration sensor S3 according to the third embodiment is the same as that of the acceleration sensor S2 according to the second embodiment. The point different from that of the acceleration sensor S2 according to the second embodiment is a configuration of the acceleration sensor S3, and the acceleration sensor S3 according to the third embodiment is characterized in that the beam 5, that is, the center of rotation of the mass 2 (line C of FIG. 7) is not coincident with the center (line B) of the cavity CA, the mass 2, and the fixed part 6.

First, the configuration of the acceleration sensor S3 according to the third embodiment is be described with reference to FIG. 7. However, the redundant contents of the second embodiment are omitted in description, and modified and added contents are mainly described.

In addition, similarly to FIG. 5 illustrating the configuration of the acceleration sensing unit S2E according to the second embodiment, for the convenience of description, FIG. 7 also illustrates through electrodes T1, T2, T7, and T8 formed in the cap layer 100 in the state that the cap layer 100 is removed.

In the acceleration sensing unit S2E in the acceleration sensor S2 according to the second embodiment, in order to displace the mass 2 in the third direction (z direction), weights in the first direction (x direction) are different from each other with respect to the beam 5 as the axis of the center of rotation. Furthermore, since the beam 5 is arranged on the center line (line B) of the cavity CA, a meaningless space (waste of space) occurs at the right side of the cavity CA2. For this reason, there is a disadvantage in miniaturization of the sensor.

Although it may be considered that the cavity CA2 is simply formed to have a size in accordance with the size of the mass 2, in this case, since the volumes of the cavities CA1 and CA2 are different, the amount of deformation of the cap layer 100 according to the change in external pressure or environment temperature is also different between the cavities CA1 and CA2. As a result, in order to generate unbalance between the detection electrodes C1 and C2, the zero-point of the sensor is changed.

In addition, a method of generating unbalance of the mass by setting the sizes of the cavities CA1 and CA2 to the sizes illustrated in FIG. 6, facing the mass 2 to be fitted into the cavities CA1 and CA2, and, for example, forming a hole or forming another film in the mass 2 in the portion of the cavity CA2 may be considered. However, in such a method, since the distances from the mass 2 that is the movable electrodes of the detection electrodes C1 and C2 to the through electrodes T3 and T5 that are the fixed electrodes are different, in order to generate unbalance between the two detection electrodes C1 and C2, the through electrodes T3 and T5 that the fixed electrodes of the through electrodes T3 and T5 cannot be extended to the portion where the hole or the film that becomes another masse is formed. For this reason, a sensitivity of the sensor which is defined an amount (ΔC) of change in capacitance per unit acceleration applied cannot be improved.

In addition, a method of forming a hole in the mass 2 to generate unbalance between the left and right portion of the mass 2 and attaching another film on the mass for the purpose of increasing capacitance of the detection electrodes C1 and C2 may also be considered. However, in this method, since there another film needs to be attached besides the support substrate 1a, the intermediate insulating layer 1b, the device layer 1c, and the cap layer 100, there occurs a problem in that the manufacturing process is complicated.

In the acceleration sensor S3 according to the third embodiment, it is possible to utilize the area without waste while solving the above-described problems. By applying the concept of the invention described with respect to the acceleration sensor S3 according to the third embodiment, it is possible to provide a small-sized, highly-sensitive acceleration sensor capable of reducing the zero-point drift caused by the mounting, environment, and temporal factors.

The fixed part 6 arranged in the acceleration sensor S3 according to the third embodiment is fixed on the support substrate 1a through the insulating layer 1b at the central portion of the cavity CA which is formed by the support substrate 1c and the cap layer 100 so as to surround the mass 2. In addition, in the fixed part 6, two beams 5 extending in the second direction (y direction) are provided at the positions (line C of FIG. 7) separated from the center line B of the cavity CA, and the mass 2 is connected to the distal ends of the fixed part 6. Namely, the beams 5 which become the center of rotation of the mass 2 are provided at the positions that are not coincident with the center of the cavity CA.

Similarly to the acceleration sensor S2 according to the second embodiment, the mass 2 is formed so that the weights of the portions divided by the beam 5 as a central axis are different in the first direction (x direction). Namely, when acceleration is applied in the third direction (z direction), the force exerted on the mass 2 at the left side of the beam 5, and the force exerted on the mass at the right side are different. In addition, since the distance from the center of the right portion of the mass 2 as seen from the beam 5 to the beam 5 and the distance from the center of the left portion of the mass 2 to the beam 5 are also different, unbalance is generated in the moment acting on the beam 5 which becomes the center of rotation of the mass 2. For this reason, the mass 2 is rotated around in the second direction (y direction) by using the beam 5 as a center of rotation in proportion to the acceleration applied in the third direction (z direction).

For the purpose of detecting the displacement of the mass 2, the through electrodes T3 and T4 as the fixed electrodes C1B and C2B of the detection electrodes C1 and C2 are formed in the cap layer 100 to form electrostatic capacitance between the through electrodes and the mass 2. Pads E4 and E5 are formed on the through electrodes T3 and T4, respectively, so that the through electrodes are electrically connected to the signal processing IC 50.

The through electrodes T3 and T4 which become the fixed electrodes of the detection electrodes C1 and C2 are formed so as to be equally spaced in the first direction (x direction) by using the cavity CA (line B of FIG. 7) as a symmetry axis and so as to form the same magnitude of electrostatic capacitance. Namely, the through electrodes are arranged to be asymmetric with respect to the beam 5.

In addition, similarly to the acceleration sensor S2 according to the second embodiment, a plurality of through electrodes T1, T2, T7, and T8 are connected to the fixed part 6 supporting the mass 2, and the through electrodes have a function of allowing electric signals to be input to or output from the mass 2, a function as detection electrodes for checking whether or not the connection between the cap layer 100 and the device layer 1c is correct, and a function as posts for suppressing a change in capacitance of the detection electrodes C1 and C2 due to the deformation of the cap layer 100.

The through electrodes T1, T2, T7, and T8 separates the cavity CA into two cavities CA1 and CA2 having the same volume while suppressing the deformation of the cavity CA. Herein, for the convenience of description, the case where the cavity CA is separated into two cavities is exemplified. However, for example, if the through electrodes are arranged on the central axes extending in the first direction (x direction) and the second direction (y direction) of the cavity CA, the four cavities having the same volumes may be configured.

Namely, since the cavities having the same size are configured with respect to the center line (line B) of the cavity CA as a reference, similarly, since the detection electrodes C1 and C2 having the same capacitance with respect to the center line (line B) as a reference are arranged with an equal distance, even in the case where the environment temperature is changed or the acceleration sensing unit S3E or the cap layer 100 is deformed during the pressure-molding of the thermosetting resin, the output of the sensor is maintained to be 0. Therefore, it is possible to suppress the individual difference of the initial zero point in the shipment stage of the sensor and the change of the zero-point output depending on the elapse of time and the environment.

In the acceleration sensor S3 according to the third embodiment, as illustrated in FIG. 1, the signal processing IC 50 is mounted on the lead frame 150 through the adhesive 151, and the acceleration sensing unit S3E is mounted on the signal processing IC through the adhesive 151, in addition, the lead frame 150, the signal processing IC 50, and the sensing unit S3E are connected to each other through the conductive wire 152, and finally, the shape illustrated in FIG. 1 is formed by pressure-molding while heating the thermosetting resin 153.

This configuration is a general semiconductor mounting process, which is a sufficiently generalized technique. For this reason, it is inexpensive. However, inevitably, the detection electrodes C1 and C2 are located on the surface where the detection electrodes are in contact with the thermosetting resin 153, that is, the surface which the pressure is exerted on during the pressure-molding of the thermosetting resin 153.

Namely, by employing the technique disclosed with respect to the acceleration sensor S3 according to the third embodiment, even in the case where packaging using the thermosetting resin 153 which is inexpensive and the conductive wire 152 which is sufficiently validated, it is possible to provide a highly-reliable acceleration sensor of which the individual difference of the zero-point output or temporal or environment dependency is small.

Furthermore, since there is no need to allow the center (line B) of the cavity CA and the beam 5 (line C) which becomes the center or rotation of the mass 2 not to be coincident with each other, it is possible to rotate the mass 2 around the second direction in proportion to the acceleration applied in the third direction without forming a wasteful space in the cavity CA. Namely, in the case where the capacitance of the detection electrodes C1 and C2 is to be formed to be in the same level as that of the acceleration sensor S2 according to the second embodiment, it is possible to miniaturize the acceleration sensing unit S3E. Alternatively, in the case where the size of the acceleration sensing unit S3E is to be formed to be in the same level as that of the acceleration sensing unit S2E in the acceleration sensor S2 according to the second embodiment, since the detection electrodes C1 and C2 may be formed to have a large area, it is possible to increase the amount ($\Delta C$) of change in capacitance per unit acceleration applied. As a result, it is possible to achieve a highly sensitive sensor.

Figure 9:
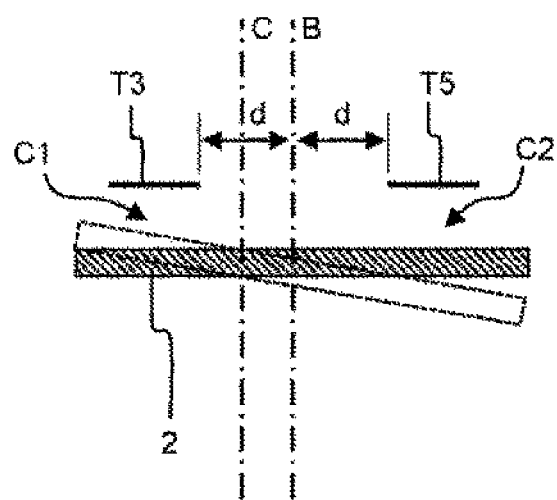
FIG. 9 is a conceptual diagram illustrating a principle of detection of the acceleration sensor according to the third embodiment.

However, as illustrated in FIG. 9, in the case where the detection electrodes C1 and C2 are arranged symmetrically with respect to the center line (line B) of the cavity CA and the center (line C) of rotation of the mass 2 are allowed not to be coincident with each other, the amounts ($\Delta C1$ and $\Delta C2$) of change in capacitance of the detection electrodes C1 and C2 per unit acceleration applied are different from each other. Furthermore, since the detection electrodes C1 and C2 together with the mass 2 and the through electrodes T3 and T5 form a parallel flat, there is a problem in that the linearity of the amounts ($\Delta C1$ and $\Delta C2$) of change in capacitance of the detection electrodes C1 and C2 is deteriorated according to the rotation angle of the mass 2 or the amount of displacement in the third direction (z direction).

Figure 10:
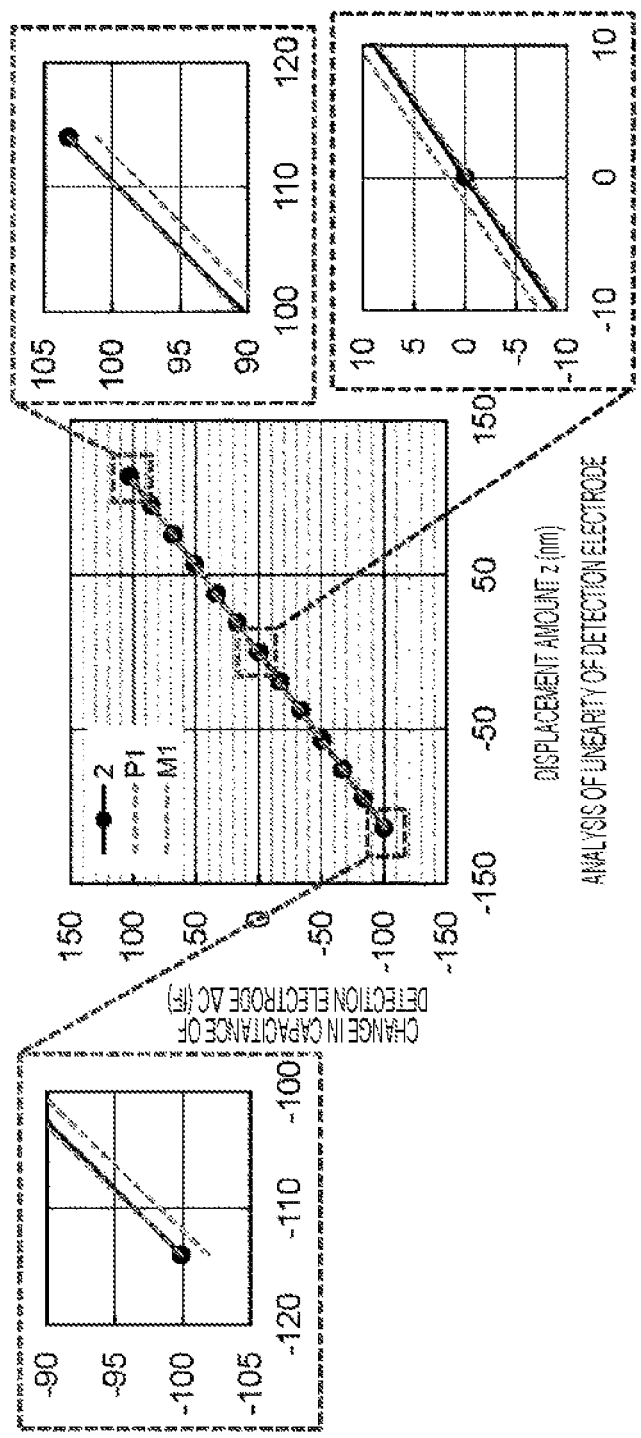
FIG. 10 is a graph of analysis of linearity of a detection electrode of the acceleration sensor according to the third embodiment.

FIG. 10 is a result of analysis of the amount in change of capacitance (since the differential detection is performed, $\Delta C=\Delta C1-\Delta C2$) according to the amount of displacement in the third direction (z direction) of the mass 2, for example, in the case where the amounts of capacitance of the detection electrodes C1 and C2 are set to 2 pF and the gap between the mass 2 and the through electrodes T3 and T5 is set to 2 μm. A solid line indicates $\Delta C$ according to the amount of displacement, and dotted lines which are illustrated to interpose the solid line at upper and lower sides indicate a range of linearity of ±0.5% according to the displacement of ±115 nm.

Namely, in the acceleration sensor S3 according to the third embodiment, although theoretical linearity of the sensor output is deteriorated, if the distance between the center (line B) of the cavity CA and the center (line C) of rotation of the mass 5, the sizes of the detection electrodes C1 and C2, the amount of displacement of the mass in the third direction and the like are appropriately adjusted, it is possible to sufficiently satisfy linearity requirements which are required, for example, for an anti-skid system of a vehicle, touch correction of a camera, and the like. As a result, it is possible to achieve a miniaturized, highly-sensitive sensor and to apply inexpensive technique of the related art while suppressing a change in zero point according to initial individual difference, environment dependency, and the elapse of time.

In the acceleration sensing unit S3E of the acceleration sensor S3 according to the third embodiment, the beam 5 is provided to the fixed part 6. However, if the beam 5 is deviated from the central portion of the cavity CA, the beam needs not to be directly connected to the fixed part 6. For example, even in the case where the beam is connected from the fixed part 6 through a member that is hard to be deformed in the first, second, and third directions, there is no problem.

If a plurality of the posts are used, similarly to the first acceleration sensor, it is possible to check whether each post is correctly connected to the device layer.

Heretofore, while the present invention is described with respect to the embodiments contrived by the inventors, the present invention is not limited to the embodiments, but it should be noted that various changes are available within a scope without departing from the spirit of the invention.

In addition, in the first to third embodiments heretofore, for the convenience of description, the case of employing a packaging, technique using a thermosetting resin is described, but since the acceleration sensing unit is configured with a plurality of materials, a modification where a deformation of the acceleration sensing unit according to a difference in linear expansion coefficient is also easily considered. For this reason, the concept of the present invention can be applied to various packaging techniques which are involved with self-deformation of the acceleration sensing unit or distortion according to the mounting, for example, ceramic package, pre-mold package where plastic is molded in advance and components are mounted in the plastic, and the like.

For this reason, in the second and third embodiments, the case where the detection electrodes C1 and C2 are provided in the side of the cap layer 100 are mainly exemplified and described. However, even in the case where the detection electrodes C1 and C2 are provided in the side of the support substrate 1a, the concept of the present invention can be applied.

INDUSTRIAL APPLICABILITY

The present invention can be widely applied to the fields of sensors for posture detection of a vehicle, a robot, and the like, blur correction of a camera, posture/direction detection of navigation, posture detection of a game machine, and the like. Particularly, in the case of use of a mobile object or existence of a heat source such as an engine, a motor, an electromagnet, a microcomputer, or the like in the periphery, it is expected that the great effects are exhibited.

REFERENCE SIGNS LIST

S1 acceleration sensor
S2 acceleration sensor
S3 acceleration sensor
1a support substrate
1b intermediate insulating layer
1c device layer
2 mass
5 support beam
6 fixed part
C1 detection electrode
C2 detection electrode
C1A movable electrode of detection electrode
C2A movable electrode of detection electrode
C1B fixed electrode of detection electrode
C2B fixed electrode of detection electrode
CA cavity
CA1 cavity
CA2 cavity
C1U upper cavity
C2U upper cavity
C1D lower cavity
C2D lower cavity
T1 through electrode (post)
T2 through electrode (post)
T3 through electrode (post)
T4 through electrode (post)
T5 through electrode (post)
T6 through electrode (post)
T7 through electrode (post)
T8 through electrode (post)
E1 pad
E2 pad
E3 pad
E4 pad
E5 pad
101 insulating film
50 IC
51 carrier wave
52 CV conversion unit
53 synchronization detection circuit
54 AD conversion unit
100 cap layer
150 lead frame
151 adhesive
152 wire
153 thermosetting resin

The invention claimed is:

1. An electrostatic capacitance detection type acceleration sensor comprising:
a support substrate having a first direction and a second direction orthogonal thereto in a single surface;
a device layer disposed on the support substrate with a space interposed therebetween; and
a cap layer disposed on the device layer with a space interposed therebetween, the device layer having a mass provided therein, the mass configured to be displaced according to application of acceleration, wherein:

the mass is configured to rotate around the first direction according to application of acceleration in a third direction orthogonal to the first direction and the second direction so as to be displaced in the third direction, detection electrodes are provided at the mass and at least one of the support substrate and the cap layer, and are configured to output an indication of the displacement of the mass as an electric signal according to a change in electrostatic capacitance between the detection electrodes, the mass and a center of a cavity which is configured with the support substrate and the cap layer to surround the mass are provided to be coincident with each other, the device layer comprises a fixed portion disposed in a central portion of the mass, two beams are provided that connect the mass and the support substrate, and that extend parallel to an edge of the fixed portion, an axis of rotation of the mass rotating around the first direction lies along the two beams and the edge of the fixed portion, the detection electrodes are equally spaced from the center of the mass and the center of the cavity, a plurality of posts are provided in the central portion of the mass, and the posts are configured to input or output an electric signal.

2. The acceleration sensor according to claim 1, wherein the plurality of the posts are formed so as to connect the support substrate, the mass, and the cap layer, and are provided on the center line of the mass.

3. The acceleration sensor according to claim 1, wherein the plurality of the posts are formed so as to connect the support substrate, the mass, and the cap layer, and are provided symmetrically with respect to the center line of the mass.

4. The acceleration sensor according to claim 1, wherein the support substrate, the device layer, and the cap layer are made of silicon.

5. The acceleration sensor according to claim 1, wherein an acceleration sensing unit which is configured with the support substrate, the device layer, and the cap is packaged with a pressure-molded thermosetting resin.

6. The acceleration sensor according to claim 5,
wherein a control circuit which applies an electric signal to the acceleration sensing unit and processes the electric signal from the acceleration sensing unit is arranged on a lead frame,
wherein the acceleration sensing unit is arranged on the control circuit, and
wherein the control circuit and the acceleration sensing unit are connected to each other through a conductive wire.

* * * * *